(12) United States Patent
Lee

(10) Patent No.: US 9,171,862 B2
(45) Date of Patent: Oct. 27, 2015

(54) THREE-DIMENSIONAL MEMORY AND METHOD OF FORMING THE SAME

(71) Applicant: MACRONIX International Co., Ltd., Hsinchu (TW)

(72) Inventor: Guan-Ru Lee, Hsinchu (TW)

(73) Assignee: MACRONIX International Co., Ltd., Hsinchu (TW)

(*) Notice: Subject to any disclaimer, the term of this patent is extended or adjusted under 35 U.S.C. 154(b) by 40 days.

(21) Appl. No.: 14/163,815

(22) Filed: Jan. 24, 2014

(65) Prior Publication Data
US 2015/0214241 A1 Jul. 30, 2015

(51) Int. Cl.
| | |
|---|---|
| *H01L 27/115* | (2006.01) |
| *H01L 21/3105* | (2006.01) |
| *H01L 21/02* | (2006.01) |
| *H01L 49/02* | (2006.01) |
| *H01L 27/108* | (2006.01) |

(52) U.S. Cl.
CPC ...... *H01L 27/11582* (2013.01); *H01L 21/0214* (2013.01); *H01L 21/0217* (2013.01); *H01L 21/02164* (2013.01); *H01L 21/31053* (2013.01); *H01L 27/10852* (2013.01); *H01L 27/115* (2013.01); *H01L 27/11556* (2013.01); *H01L 27/11568* (2013.01); *H01L 27/11578* (2013.01); *H01L 28/91* (2013.01)

(58) Field of Classification Search
CPC .............. H01L 28/91; H01L 27/10852; H01L 27/11578; H01L 27/115; H01L 27/11568
See application file for complete search history.

(56) References Cited

U.S. PATENT DOCUMENTS

| | | | | |
|---|---|---|---|---|
| 8,759,895 | B2* | 6/2014 | Tang et al. | 257/314 |
| 2010/0120214 | A1* | 5/2010 | Park et al. | 438/287 |
| 2010/0295110 | A1* | 11/2010 | Takaishi | 257/300 |
| 2011/0275197 | A1* | 11/2011 | Park et al. | 438/478 |
| 2012/0040528 | A1* | 2/2012 | Kim et al. | 438/675 |
| 2012/0086072 | A1* | 4/2012 | Yun et al. | 257/329 |
| 2012/0208347 | A1* | 8/2012 | Hwang et al. | 438/430 |
| 2013/0134377 | A1* | 5/2013 | Park et al. | 257/4 |

* cited by examiner

*Primary Examiner* — Robert Huber
*Assistant Examiner* — Xia L Cross
(74) *Attorney, Agent, or Firm* — J.C. Patents

(57) ABSTRACT

A method of forming a three-dimensional memory is provided. A stacked structure including semiconductor layers and insulating layers arranged alternately is formed on a substrate. The stacked structure is patterned to form a mesh structure having first strips extending in a first direction and second strips extending in a second direction. The first strips and the second strips intersect with each other. The mesh structure has first holes. A dielectric layer is formed in each first hole. At least a portion of the first strips of the mesh structure is removed to form second holes and bit line stacked structures separated from each other. A charge storage layer is formed on sidewall and bottom of each second hole. A gate pillar extending in a third direction is formed on each charge storage layer in the second hole. Word lines extending in the first direction are formed on the gate pillars.

7 Claims, 11 Drawing Sheets

THREE-DIMENSIONAL MEMORY AND METHOD OF FORMING THE SAME

BACKGROUND OF THE INVENTION

1. Field of Invention

The present invention relates to a semiconductor device and a method of forming the same, and more particularly to a three-dimensional memory and a method of forming the same.

2. Description of Related Art

As the demand for storage subsystems of consumer products is increased, the standard for the reading/writing speeds or capacities of products is higher, and thus, high-capacity related products have become the mainstream in the industry. Accordingly, the development of memory, especially NAND flash memory, has to respond to this demand.

However, the existing planar NAND flash memory is limited by the device critical dimension in integrated circuits, so that the miniaturization of storage memory cells faces a bottleneck. Therefore, in order to achieve a greater storage capacity and a lower cost per bit, designers seek for a three-dimensional NAND flash memory with multiple planes.

SUMMARY OF THE INVENTION

The present invention provides a three-dimensional memory and a method of forming the same, in which the device uniformity and reliability can be improved, and the bending or collapsing caused by a high aspect ratio pattern can be avoided.

The present invention provides a method of forming a three-dimensional memory. A stacked structure is formed on a substrate, wherein the stacked structure includes a plurality of semiconductor layers and a plurality of insulating layers arranged alternately. The stacked structure is patterned to form a mesh structure, wherein the mesh structure has a plurality of first strips extending in a first direction and a plurality of second strips extending in a second direction, and the first strips and the second strips intersect with each other, and wherein the mesh structure has a plurality of first holes. A dielectric layer is formed in each first hole. At least a portion of the first strips of the mesh structure are removed, so as to form a plurality of second holes and a plurality of bit line stacked structures, wherein the bit line stacked structures are separated from each other by the second holes. A charge storage layer is formed on a sidewall and a bottom of each second hole. A gate pillar extending in a third direction is formed on each charge storage layer in the corresponding second hole. A plurality of word lines extending in the first direction are formed on the gate pillars.

According to an embodiment of the present invention, the method further includes forming a cap layer on the stacked structure before the step of patterning the stacked structure, wherein a material of the cap layer is different from a material of the insulating layers.

According to an embodiment of the present invention, the step of forming the dielectric layer in each first hole includes forming a dielectric material layer on the substrate to cover the mesh structure and fill up the first holes; and planarizing the dielectric material layer until a surface of the mesh structure is exposed.

According to an embodiment of the present invention, the dielectric layer includes silicon oxide, silicon nitride, silicon oxynitride, a high-k material or a low-k material.

According to an embodiment of the present invention, the step of forming the charge storage layer on the sidewall and the bottom of each second hole includes forming a charge storage material layer on the substrate to cover surfaces of the bit line stacked structures and cover the sidewall and the bottom of each second hole; and planarizing the charge storage material layer until the surfaces of the bit line stacked structures are exposed.

According to an embodiment of the present invention, the first holes have a shape of a square, a rectangle, a rhombus, a circle or an ellipse.

According to an embodiment of the present invention, the step of forming the gate pillar on each charge storage layer in the corresponding second hole includes forming a conductive layer on the substrate to cover surfaces of the charge storage layers on the bit line stacked structures and fill up the second holes; and planarizing the conductive layer until surfaces of the bit line stacked structures are exposed.

The present invention further provides a three-dimensional memory including a plurality of bit line stacked structures, a plurality of gate pillars, a plurality of charge storage layers and a plurality of word lines. The bit line stacked structures are disposed on a substrate. Each bit line stacked structure includes a plurality of semiconductor layers and a plurality of insulating layers arranged alternately. Each bit line stacked structure includes a body part and a plurality of extending parts, the extending parts extend in a first direction and are connected to the body part, and the body part extends in a second direction different from the first direction. The gate pillars extend in a third direction, wherein one gate pillar is disposed between two opposite extending parts of two adjacent bit line stacked structures, and the third direction is different from the first and second directions. Each charge storage layer surrounds a sidewall and a bottom of the corresponding gate pillar and is disposed between the corresponding gate pillar and each of two adjacent extending parts. Each word line extends in the first direction and covers a portion of the gate pillars, a portion of the charge storage layers and a portion of the body parts and a portion of the extending parts of the bit line stacked structures.

According to an embodiment of the present invention, the three-dimensional memory further includes a cap layer disposed between the bit line stacked structures and the word lines, wherein a material of the cap layer is different form a material of the insulating layers.

According to an embodiment of the present invention, the three-dimensional memory further includes a plurality of dielectric layers separately disposed between two adjacent bit line stacked structures, wherein one dielectric layer is disposed between two adjacent charge storage layers.

The present invention also provides a method of forming a semiconductor device. A stacked structure is formed on a substrate. The stacked structure is patterned to form a mesh structure, wherein the mesh structure has a plurality of first strips extending in a first direction and a plurality of second strips extending in a second direction, and the first strips and the second strips intersect with each other, and wherein the mesh structure has a plurality of first holes. A dielectric layer is formed in each first hole. At least a portion of the first strips of the mesh structure are removed to form a plurality of second holes and a plurality of fishbone structures, wherein the fishbone structures are separated from each other by the second holes.

According to an embodiment of the present invention, the stacked structure includes a plurality of semiconductor layers and a plurality of insulating layers arranged alternately.

According to an embodiment of the present invention, the method further includes forming a cap layer on the stacked structure before the step of patterning the stacked structure, wherein a material of the cap layer is different from a material of the insulating layers.

According to an embodiment of the present invention, the step of forming the dielectric layer in each first hole includes forming a dielectric material layer on the substrate to cover the mesh structure and fill up the first holes; and planarizing the dielectric material layer until a surface of the mesh structure is exposed.

According to an embodiment of the present invention, the dielectric layer includes silicon oxide, silicon nitride, silicon oxynitride, a high-k material or a low-k material.

According to an embodiment of the present invention, the first holes have a shape of a square, a rectangle, a rhombus, a circle or an ellipse.

In view of the above, with the method of the invention, the semiconductor device (e.g. three-dimensional memory) can be provided with improved device uniformity and reliability, and the bending or collapsing caused by a high aspect ratio pattern can be avoided.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1A to FIG. 11A are surface views illustrating a method of forming a three-dimensional memory according to an embodiment of the present invention.

FIG. 1B to FIG. 4B are cross-sectional views taken along the line A-A of FIG. 1A to FIG. 4A.

FIG. 5B to FIG. 11B are cross-sectional views taken along the line B-B of FIG. 5A to FIG. 11A.

DESCRIPTION OF EMBODIMENTS

Figure 1A:
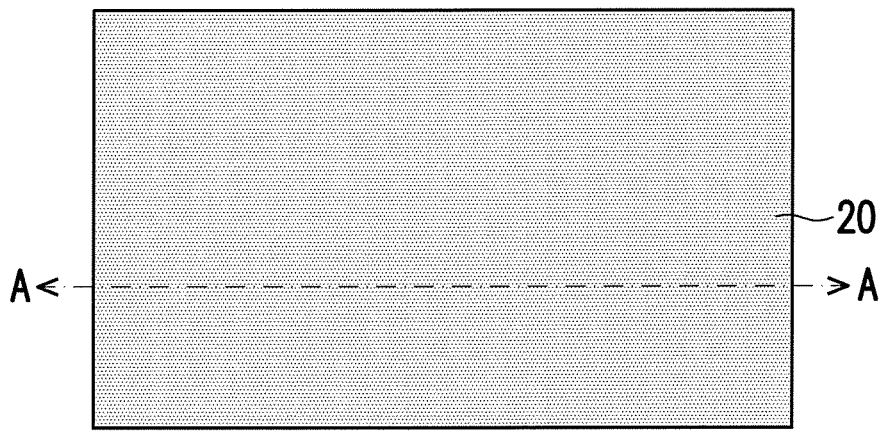

Reference will now be made in detail to the present preferred embodiments of the invention, examples of which are illustrated in the accompanying drawings. Wherever possible, the same reference numbers are used in the drawings and the description to refer to the same or like parts.

The present invention is related to a method of forming a strip-shaped stacked structure having a high aspect ratio with a dual-hole-patterning process. In this method, a stacked structure is patterned to form a mesh structure, and a dielectric layer is filled in the (first) holes of the mesh structure. Thereafter, the extending parts of the mesh structure are removed to form multiple strip-shaped stacked structures. Specifically, in the process for forming the first holes, the mesh structure is formed to extend in two directions, so as to provide enough support force for the patterned stacked structure. Therefore, bending and collapsing of the conventional stacked structure extending only in a single direction can be avoided. Besides, in the process for breaking the extending parts to form the second holes, the dielectric layer filled in the holes of the mesh structure can be used for stabilizing the mesh structure, so as to prevent bending and collapsing of the conventional stacked structure extending only in a single direction.

The following embodiment in which a method of forming a three-dimensional memory is provided for illustration purposes, and is not construed as limiting the present invention. It is appreciated by people having ordinary in the art that the method of the invention can be applied to form a strip-shaped stacked structure having a high aspect ratio. Besides, in the following embodiment, the stacked structure includes insulating layers and semiconductor layers arranged alternately, but the prevent invention is not limited thereto. The invention can be applied to any stacked structure including two or more layers selected from insulating layers, semiconductor layers, metal layers and metal silicide layers.

FIG. 1A to FIG. 11A are surface views illustrating a method of forming a three-dimensional memory according to an embodiment of the present invention. FIG. 1B to FIG. 4B are cross-sectional views taken along the line A-A of FIG. 1A to FIG. 4A. FIG. 5B to FIG. 11B are cross-sectional views taken along the line B-B of FIG. 5A to FIG. 11A.

Figure 1B:
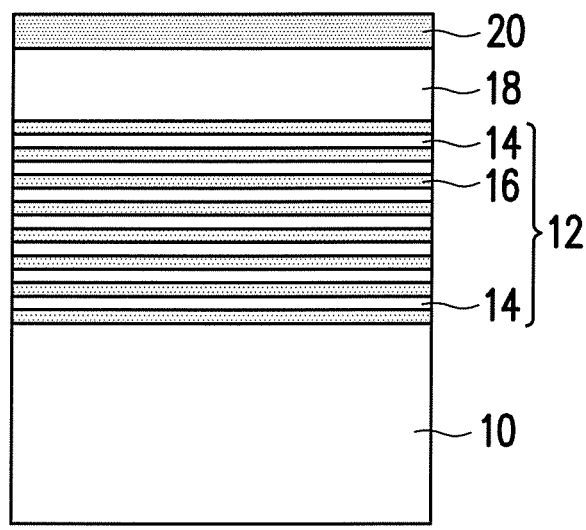

Referring to FIG. 1A and FIG. 1B, a stacked structure 12 is formed on a substrate 10. The stacked structure 12 includes a plurality of insulating layers 14 and a plurality of semiconductor layers 16 arranged alternately. The insulating layers 14 include a dielectric material, such as silicon oxide, silicon nitride, silicon oxynitride or a combination thereof. The insulating layers 14 can have the same or different thicknesses. The thickness of the insulating layers 14 can be, for example but not limited to, 200 to 500 angstroms. The semiconductor layers 16 include undoped polysilicon or doped polysilicon. The semiconductor layers 16 can have the same or different thicknesses. The thickness of the semiconductor layers 16 can be, for example but not limited to, 200 to 500 angstroms. Besides, the thicknesses and numbers of layers of the insulating layers 14 and the semiconductor layers 16 are not limited by the said descriptions and the figures, and can be adjusted upon the actual requirements.

Thereafter, cap layers 18 and 20 are formed on the stacked structure 12. The cap layer 18 includes a dielectric material, such as silicon oxide, silicon nitride, silicon oxynitride or a combination thereof. The cap layer 18 has a material different from that of the insulating layers 14. Besides, the thickness of the cap layer 18 is greater than that of each insulating layer 14. The cap layer 20 includes a dielectric material, such as silicon oxide, silicon nitride, silicon oxynitride or a combination thereof. The cap layers 18 and 20 can include the same or different materials. Each of the cap layers 18 and 20 can be formed with a chemical vapour deposition (CVD) process.

Figure 2A:
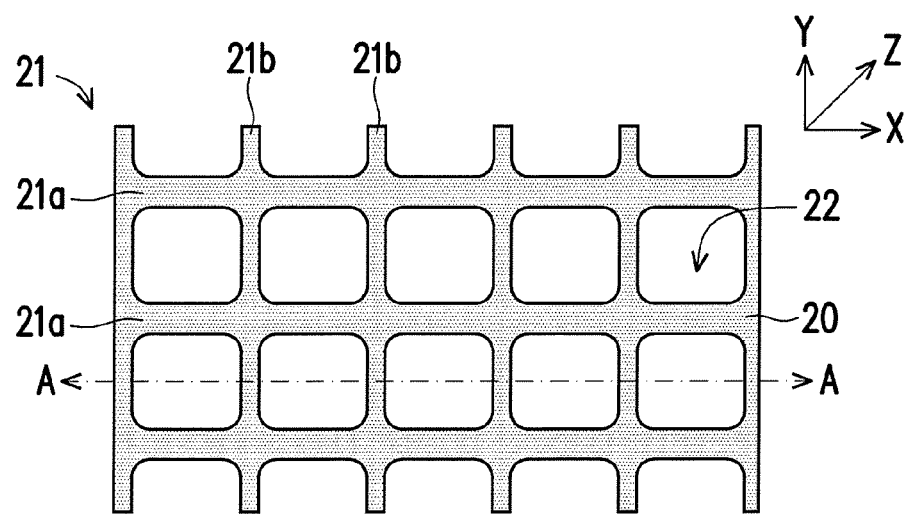
Figure 2B:
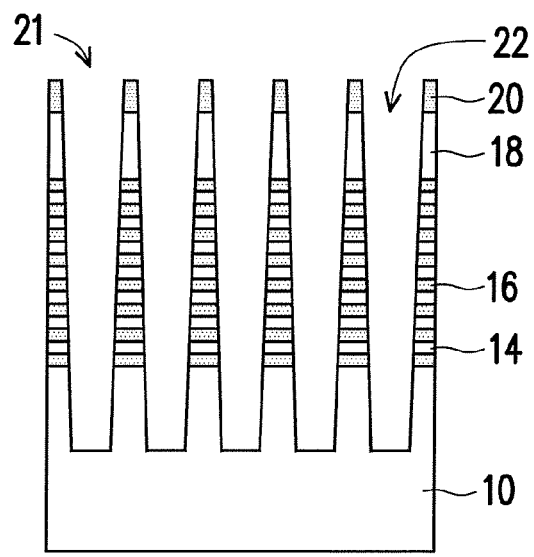

Referring to FIG. 2A and FIG. 2B, the stacked structure 12 and the cap layers 18 and 20 are patterned to form a mesh structure 21 and form a plurality of holes 22 in the substrate 10. Specifically, the holes 22 are formed through the stacked structure 21 and extend into the substrate 10. The mesh structure 21 has a plurality of first strips 21a extending in a first direction and a plurality of second strips 21b extending in a second direction, and the first strips 21a and the second strips 21b intersect with each other. The first direction is different from the second direction. In an embodiment, the first direction is perpendicular to the second direction. For example, the first direction is X-direction, and the second direction is Y-direction. The holes 22 can have a shape of a square, a rectangle, a rhombus or a polygon having five or more sides, each corner of which can be angular or rounded. Besides, the holes 22 can also have a shape of a circle or an ellipse. The mesh structure 21 extends in two directions rather than a single direction, so as to provide enough support force for the patterned stacked structure and therefore prevent bending and collapsing of the conventional stacked structure extending only in a single direction.

Figure 3A:
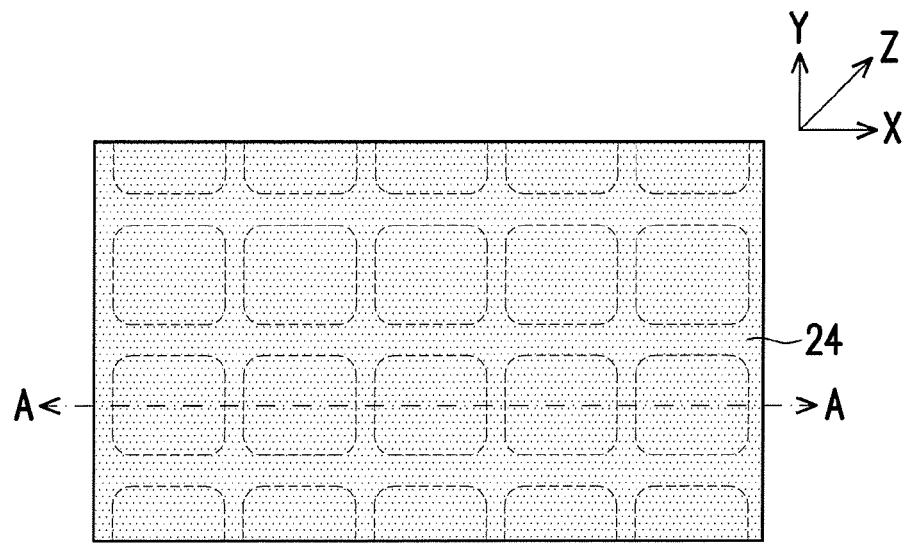
Figure 3B:
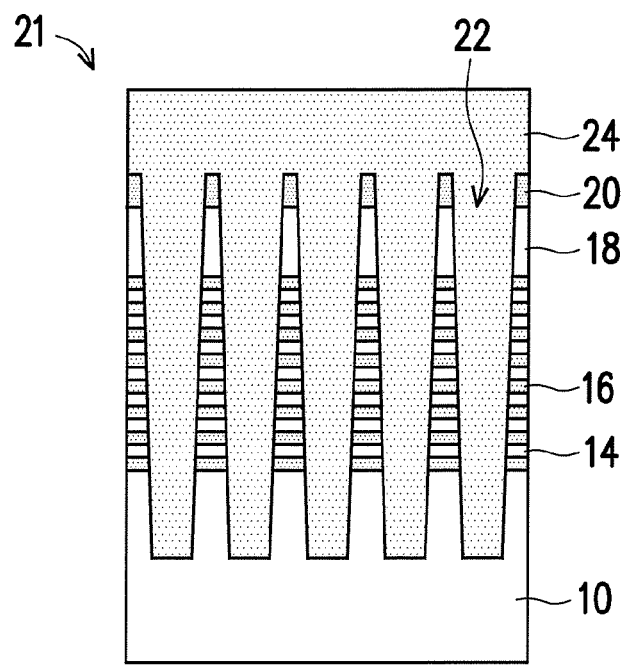

Referring to FIG. 3A and FIG. 3B, a dielectric material layer 24 is formed on the substrate 10 to cover the mesh structure 21 and fill up the holes 22. The dielectric material layer 24 includes an organic material, an inorganic material or a combination thereof. The dielectric material layer 24 can include TetraEthylOrthoSilicate-silicon oxide (TEOS-silicon oxide), undoped silicate glass (USG), borophosphosilicate glass (BPSG), phosphosilicate glass (PSG), a high-k material, a low-k material or a combination thereof. The high-k material is a material with a dielectric constant higher than 4. The low-k material is a material with a dielectric constant less than 4. The dielectric material layer 24 can be formed with a high-density plasma CVD (HPCVD) process, a sub-atmospheric CVD process, a high aspect ratio process (HARP), a high-temperature thermal oxidation process, a low-pressure CVD process, a high density plasma CVD (HDPCVD) or the like.

Figure 4A:
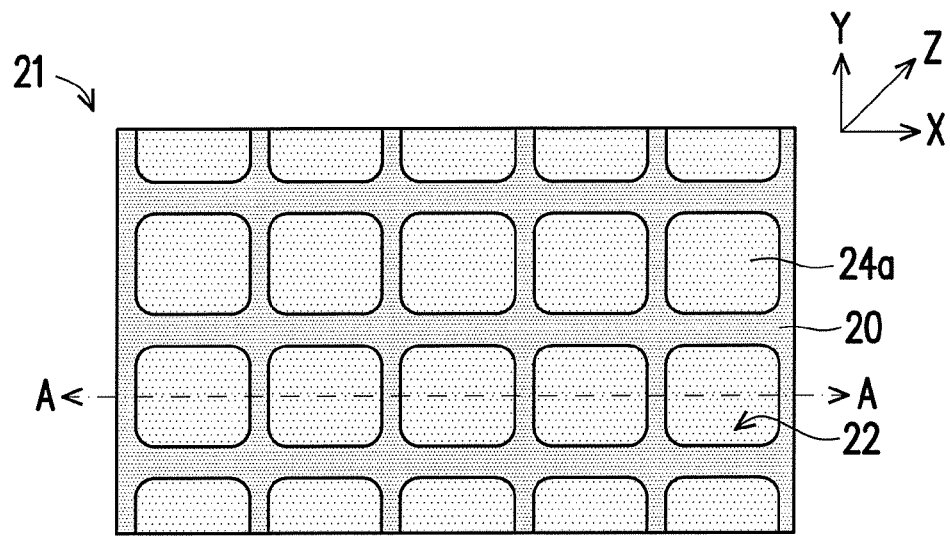
Figure 4B:
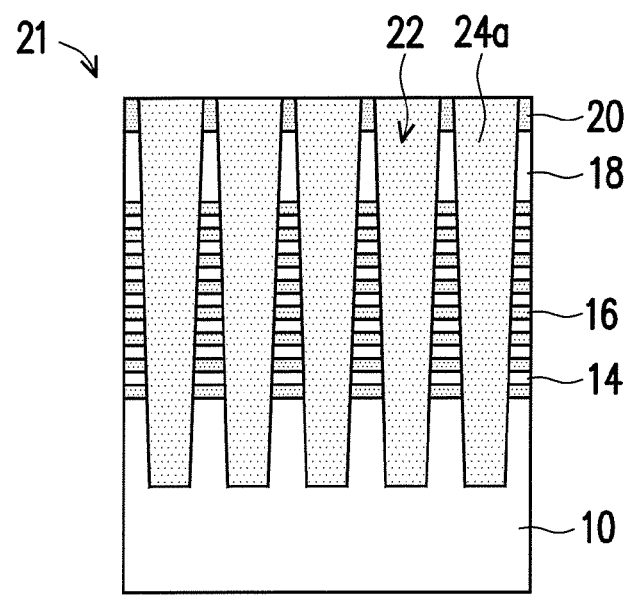

Referring to FIG. 4A and FIG. 4B, a planarization process can be performed to the dielectric material layer 24 until the surface of the mesh structure 21 is exposed, and thus, the remaining dielectric material layer 24 forms a dielectric layer (or called an insulating pillar) 24a in each hole 22. The planarization process can be a chemical polishing mechanical (CMP) process with the cap layer 20 as a polishing stop layer. The dielectric layers (or called insulating pillars) 24a extend in a third direction, such as Z-direction. The dielectric layers (or called insulating pillars) 24a can further stabilize the mesh structure 21.

Figure 5A:
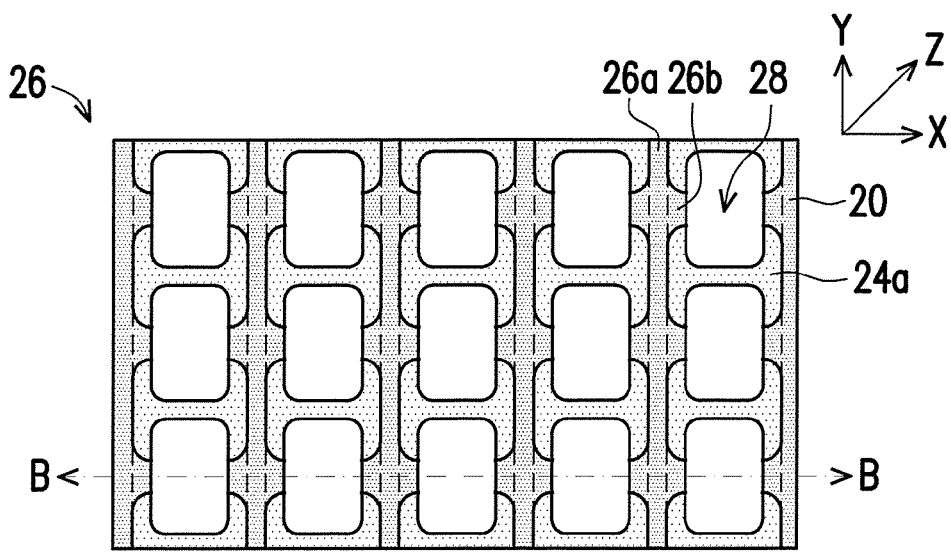
Figure 5B:
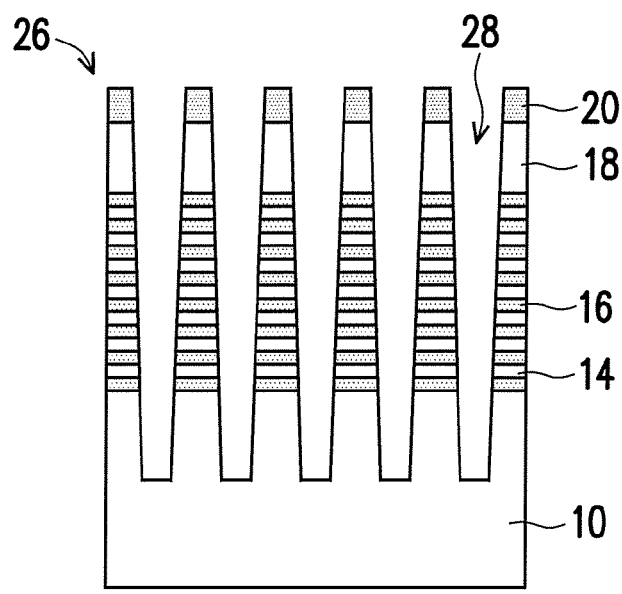

Referring to FIG. 5A and FIG. 5B, at least a portion of first strips 21a of the mesh structure mesh is removed, so as to form a plurality of holes 28 and a plurality of bit line stacked structures (or called first conductive line structures or strip-shaped structures) 26. Each bit line stacked structure 26 includes a body part 26a and a plurality of extending parts 26b. The body part 26a extends in the second direction. The extending parts 26b extend in the first direction and are connected to the body part 26a. The extending parts 26b of the two adjacent bit line stacked structures 26 correspond to each other. In an embodiment, each bit line stacked structure (or called first conductive line structure) 26 is a fishbone stacked structure. The body part 26a and extending prats 26b can be designed to have the same or different widths upon the actual requirements. The cap layers 18 and 20, insulating layers 14 and semiconductor layers 16 of the extending parts 26b of the bit line stacked structures 26 as well as the substrate 10 and the dielectric layers 24a are exposed at the sidewalls of the holes 28, and the substrate 10 is exposed at the bottoms of the holes 28. From another point of view, the bit line stacked structures 26 and the dielectric materials 24a form another mesh structure extending in two directions rather than a single direction, and therefore bending and collapsing of the conventional stacked structure extending only in a single direction can be avoided.

Figure 6A:
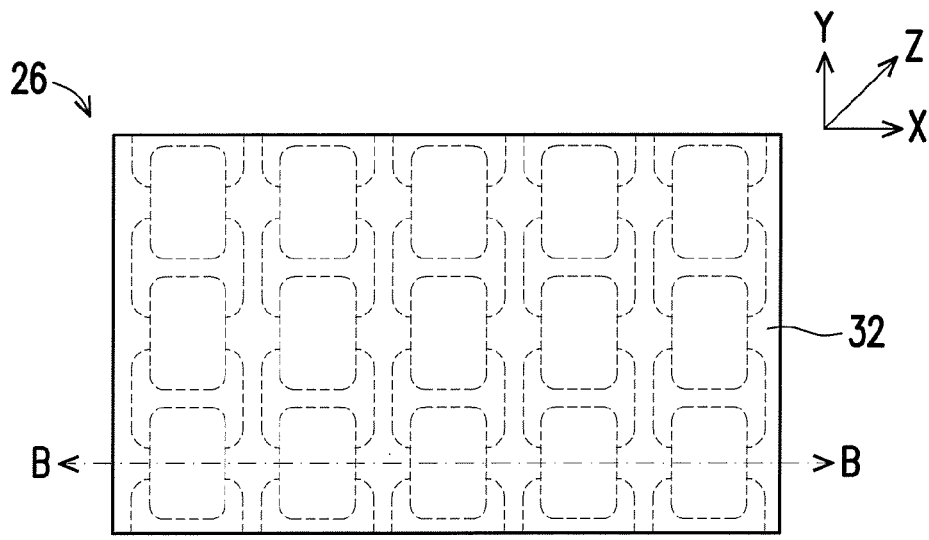
Figure 6B:
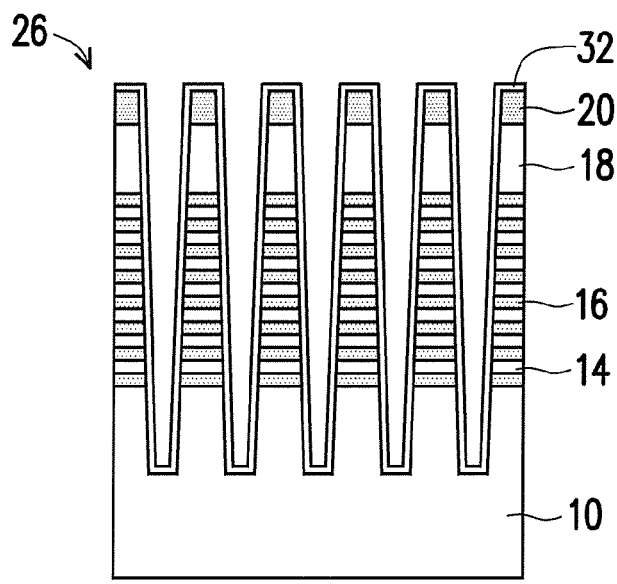

Referring to FIG. 6A and FIG. 6B, a charge storage material layer 32 is formed on the substrate 10 to cover the surfaces of the bit line stacked structures 26 and cover the sidewall and the bottom of each hole 28. The charge storage material layer 32 can be a single-layer or multi-layer material layer. The charge storage material layer 32 includes silicon nitride. In an embodiment, the charge storage material layer 32 includes a stacked structure including a silicon oxide layer, a silicon nitride layer and another silicon oxide layer. The charge storage material layer 32 can be formed with a CVD process or a thermal oxidation process.

Figure 7A:
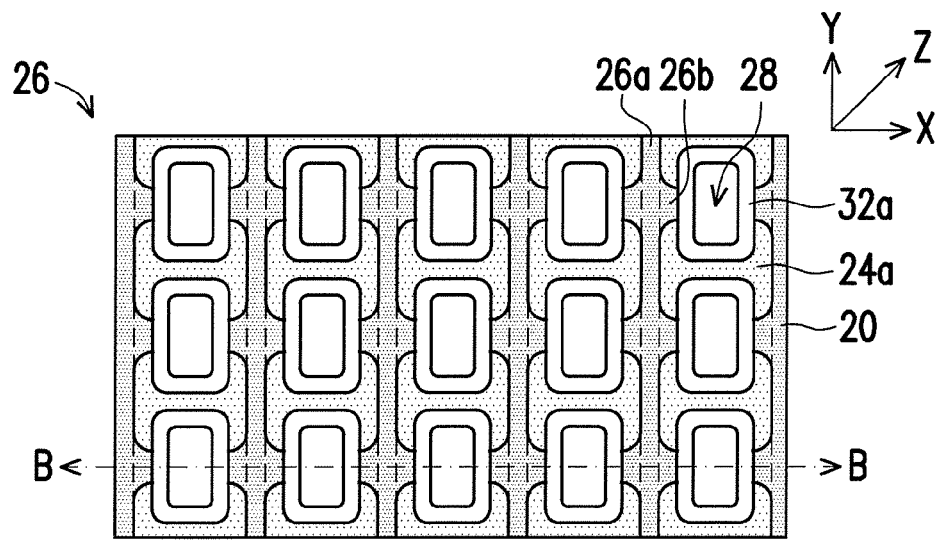
Figure 7B:
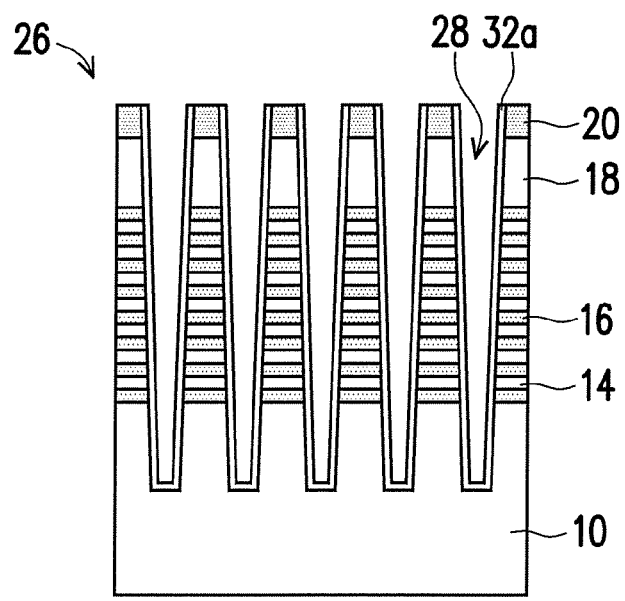

Referring to FIG. 7A and FIG. 7B, a planarization process can be performed to the charge storage material layer 32 until the surfaces of the bit line stacked structures 26 are exposed, and thus, the remaining charge storage material layer 32 forms a charge storage layer 32a in each hole 28. The planarization process can be a CMP process with the cap layer 20 as a polishing stop layer.

Figure 8A:
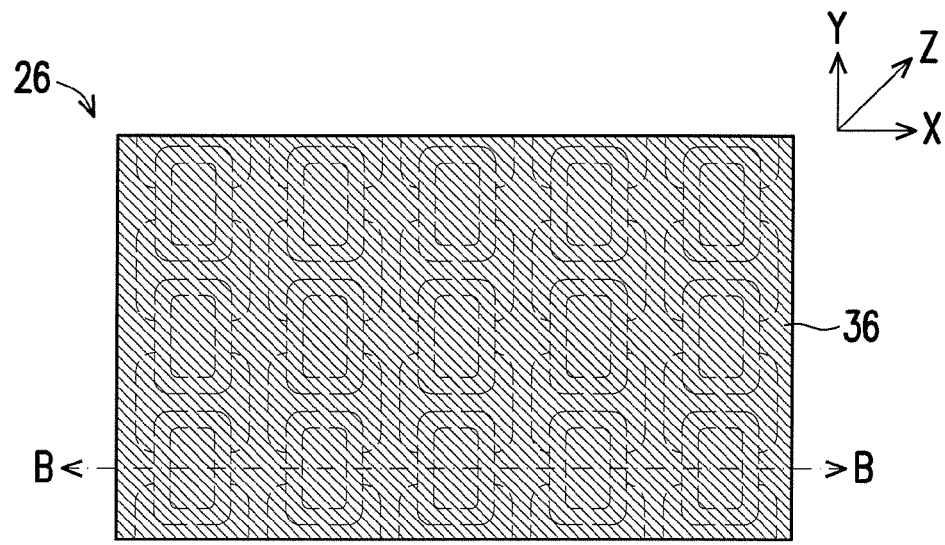
Figure 8B:
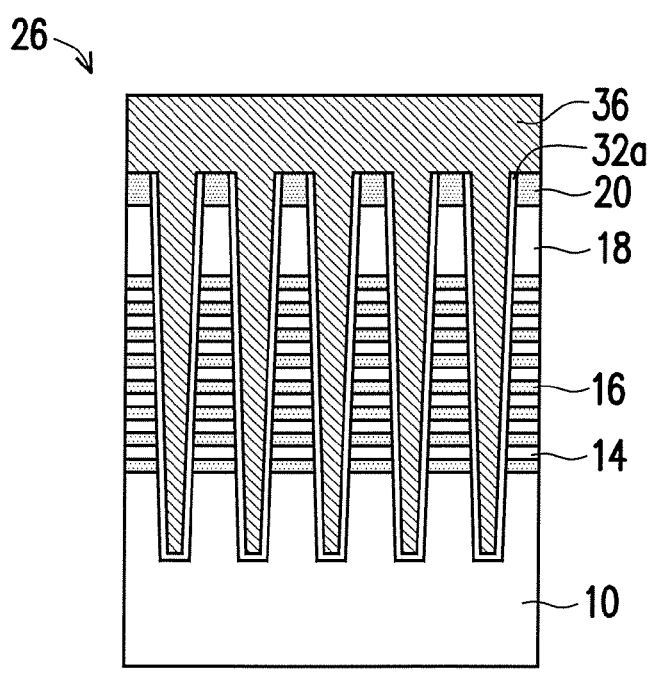

Referring to FIG. 8A and FIG. 8B, a conductive layer 36 is formed on the substrate 10 to cover the surfaces of the charge storage layers 32a on the bit line stacked structures and fill up the holes 28. The conductive layer 36 includes undoped polysilicon or doped polysilicon and can be formed with a CVD process.

Figure 9A:
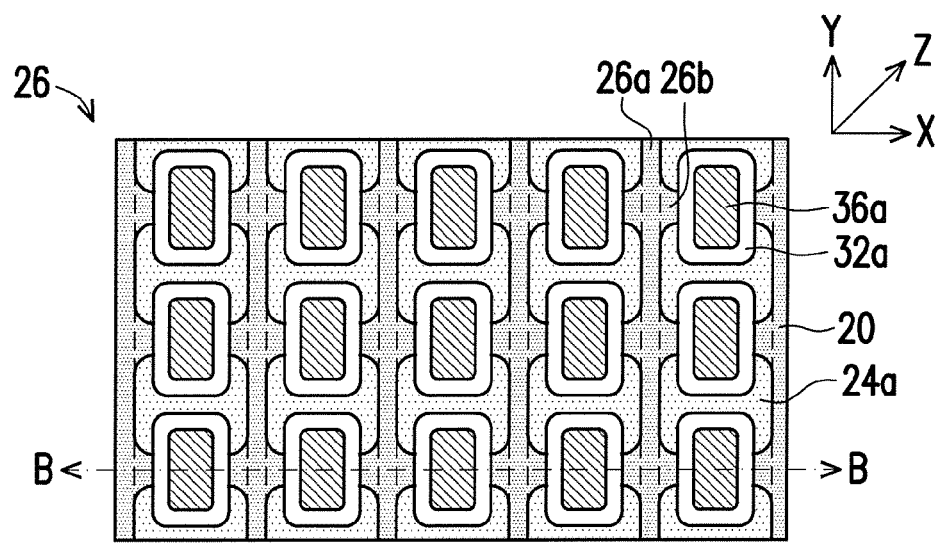
Figure 9B:
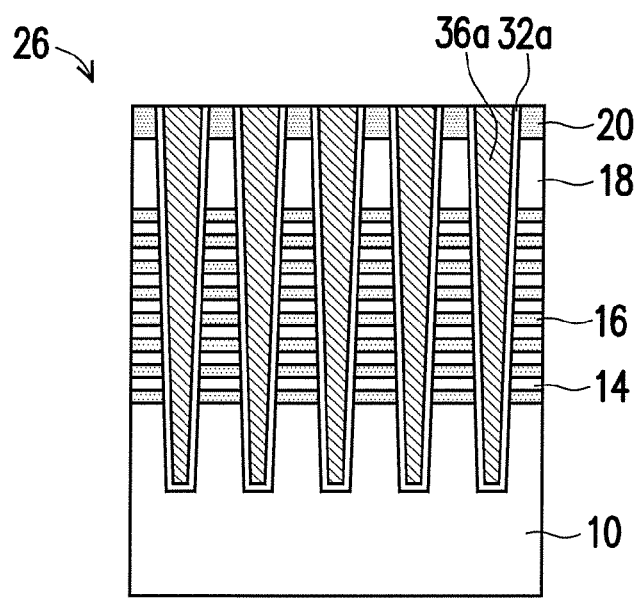

Referring to FIG. 9A and FIG. 9B, a planarization process can be performed to the conductive layer 36 until the surfaces of the bit line stacked structures 26 are exposed, and thus, the remaining conductive layer 36 forms a gate pillar (or called a conductive pillar) 36a, extending in a third direction, on the corresponding charge storage layer 32a in each hole 28. The planarization process can be a CMP process with the cap layer 20 as a polishing stop layer.

Figure 10A:
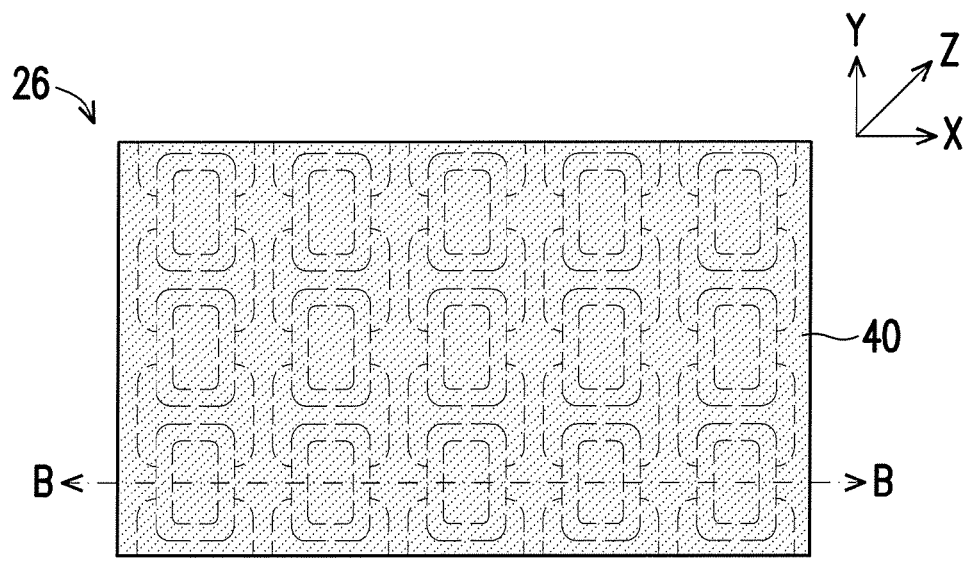
Figure 10B:
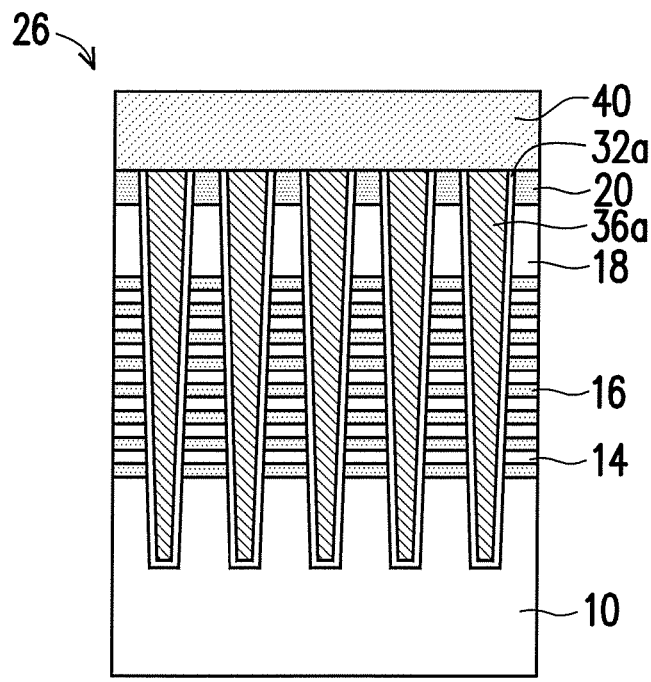
Figure 11A:
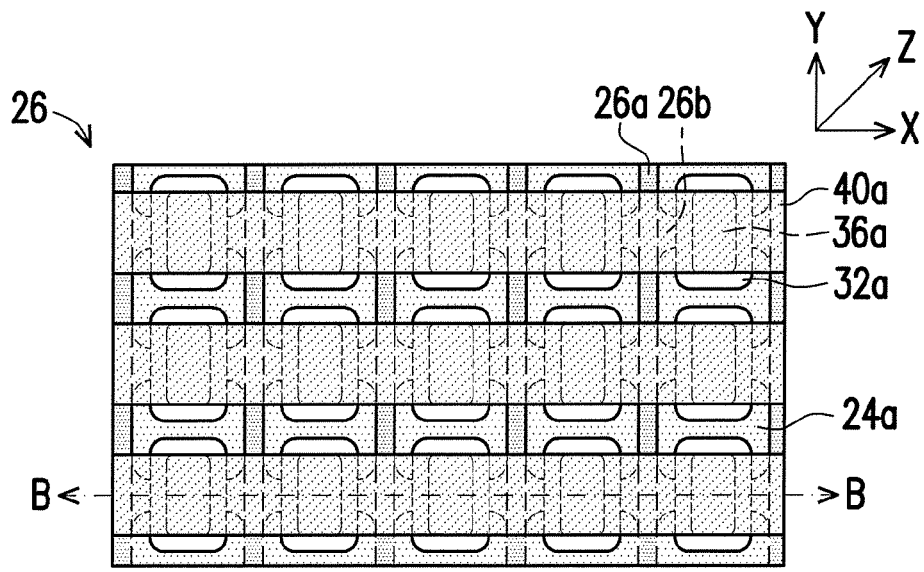
Figure 11B:
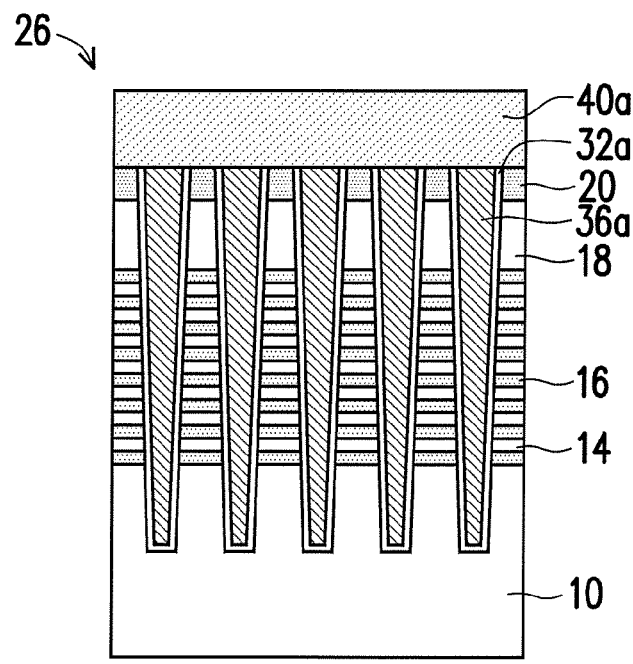

Referring to FIG. 10A and FIG. 10B, a conductive layer 40 is formed on the substrate 10 to cover the surfaces of the bit line stacked structures 26, the charge storage layers 32a and the gate pillars 36a. The conductive layer 40 can include a single-layer or multi-layer material, such as undoped polysilicon, doped polysilicon or metal silicide. The conductive layer 40 can be formed with a CVD process.

Referring to FIG. 10A and FIG. 10B, the conductive layer 40 is patterned to form a plurality of word lines (or called second conductive lines) 40a extending in the first direction. Each word line 40a covers a portion of the gate pillars 36a, a portion of the charge storage layers 32a and a portion of the bit line stacked structures 26, and is electrically connected to the gate pillars 36a arranged in the first direction. The method of patterning the conductive layer 40 includes performing photolithography and etching processes.

Referring to FIG. 9A to FIG. 11A and FIG. 9B to FIG. 11B, the three-dimensional memory of the present invention includes a plurality of bit line stacked structures (or called first conductive line stacked structures) 26, a plurality of gate pillars (or called conductive pillars) 36a, a plurality of charge storage layers 32a and a plurality of word lines (or called second conductive lines) 40a. The bit line stacked structures 26 are disposed on a substrate 10. Each bit line stacked structure 26 includes a plurality of semiconductor layers 16 and a plurality of insulating layers 14 arranged alternately. Each bit line stacked structure 26 includes a body part 26a and a plurality of extending parts 26b, the extending parts 26b extend in a first direction and are connected to the body part 26a, and the body part 26a extends in a second direction. The gate pillars 36a extend in a third direction. One gate pillar 36a is disposed between two opposite extending parts 26b of two adjacent bit line stacked structures 26. The gate pillars 36a are arranged in an array extending in the first and second directions. The first direction is different from the second direction. The third direction is different from the first and second directions. In an embodiment, the first direction is X-direction, the second direction is Y-direction, and the third direction is Z-direction. Each charge storage layer 32a surrounds the sidewall and the bottom of the corresponding gate pillar 36a and is disposed between the corresponding gate pillar 36a and each of two adjacent extending parts 26b. Each word line 40a extends in the first direction and covers a portion of the gate pillars 36a, a portion of the charge storage layers 32a and a portion of the body parts 26a and a portion of the extending parts 26b of the bit line stacked structures 26.

Besides, the three-dimensional memory of the invention further includes a cap layer 20 and a plurality of dielectric layers 24a. The cap layer 20 is disposed between the bit line stacked structures 26 and the word lines 40a. The dielectric layer 24a are separately disposed between two adjacent bit line stacked structures 26, and one dielectric layer 24a is disposed between two adjacent charge storage layers 32a.

In summary, in the said embodiment of the present invention, a method of forming a bit line stacked structure includes patterning a stacked structure to form a mesh structure, filling a dielectric layer in the holes of the mesh structure, and breaking the extending parts of the mesh structure. Since the mesh structure extends in two directions, it can provide enough support force for the patterned stacked structure, so as to prevent bending and collapsing of the conventional stacked structure extending only in a single direction. Besides, before the step of breaking the extending parts, the holes of the mesh structure have been filled with the dielectric layer, so that the dielectric layer can be used for stabilizing the mesh structure. Therefore, bending and collapsing of the conventional stacked structure extending only in a single direction can be avoided.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method of forming a three-dimensional memory, comprising:
    forming a stacked structure on a substrate, wherein the stacked structure comprises a plurality of semiconductor layers and a plurality of insulating layers arranged alternately;
    patterning the stacked structure to form a mesh structure, wherein the mesh structure has a plurality of first strips extending in a first direction and a plurality of second strips extending in a second direction, and the first strips and the second strips intersect with each other, and wherein the mesh structure has a plurality of first holes;
    forming a dielectric layer in each of the first holes;
    after the step of patterning the stacked structure, removing at least a portion of the first strips of the mesh structure, so as to form a plurality of second holes and a plurality of bit line stacked structures, wherein the bit line stacked structures are separated from each other by the second holes;
    forming a charge storage layer on a sidewall and a bottom of each of the second holes;
    forming a gate pillar extending in a third direction on each charge storage layer in the corresponding second hole; and
    forming a plurality of word lines extending in the first direction on the gate pillars.

2. The method of claim 1, further comprising forming a cap layer on the stacked structure before the step of patterning the stacked structure, wherein a material of the cap layer is different from a material of the insulating layers.

3. The method of claim 1, wherein the step of forming the dielectric layer in each of the first holes comprises:
    forming a dielectric material layer on the substrate to cover the mesh structure and fill up the first holes; and
    planarizing the dielectric material layer until a surface of the mesh structure is exposed.

4. The method of claim 1, wherein the dielectric layer comprises silicon oxide, silicon nitride, silicon oxynitride, a high-k material or a low-k material.

5. The method of claim 1, wherein the step of forming the charge storage layer on the sidewall and the bottom of each of the second holes comprises:
    forming a charge storage material layer on the substrate to cover surfaces of the bit line stacked structures and cover the sidewall and the bottom of each of the second holes; and
    planarizing the charge storage material layer until the surfaces of the bit line stacked structures are exposed.

6. The method of claim 1, wherein the first holes have a shape of a square, a rectangle, a rhombus, a circle or an ellipse.

7. The method of claim 1, wherein the step of forming the gate pillar on each charge storage layer in the corresponding second hole comprises:
    forming a conductive layer on the substrate to cover surfaces of the charge storage layers on the bit line stacked structures and fill up the second holes; and
    planarizing the conductive layer until surfaces of the bit line stacked structures are exposed.

* * * * *